(12) United States Patent
Hikida

(10) Patent No.: US 8,466,026 B2
(45) Date of Patent: Jun. 18, 2013

(54) SEMICONDUCTOR DEVICE AND METHOD FOR MANUFACTURING THE SAME

(75) Inventor: Satoshi Hikida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 317 days.

(21) Appl. No.: 12/805,621

(22) Filed: Aug. 10, 2010

(65) Prior Publication Data

US 2011/0042756 A1    Feb. 24, 2011

(30) Foreign Application Priority Data

Aug. 18, 2009  (JP) .................................. 2009-188925

(51) Int. Cl.
*H01L 21/8234*  (2006.01)

(52) U.S. Cl.
USPC ............. 438/275; 257/E21.616; 257/E27.061

(58) Field of Classification Search
USPC ............ 438/275; 257/392, E21.616, E27.061
See application file for complete search history.

(56) References Cited

U.S. PATENT DOCUMENTS

| | | |
|---|---|---|
| 5,493,142 A | 2/1996 | Randazzo et al. |
| 6,121,092 A | 9/2000 | Liu et al. |
| 2003/0081363 A1 | 5/2003 | Kawashima et al. |
| 2004/0004229 A1 | 1/2004 | Akiyama ...................... 257/173 |
| 2004/0212019 A1 | 10/2004 | Shinohara et al. |
| 2007/0281414 A1 | 12/2007 | Ohkawa et al. |

FOREIGN PATENT DOCUMENTS

| | | |
|---|---|---|
| JP | 05-003173 | 1/1993 |
| JP | 09-507723 | 8/1997 |
| JP | 10-125913 | 5/1998 |
| JP | 10-256390 | 9/1998 |
| JP | 2000-243850 | 9/2000 |
| JP | 2002-009281 | 1/2002 |
| JP | 2003-133433 | 5/2003 |
| JP | 2004-047721 | 2/2004 |
| JP | 2004-039775 | 5/2004 |
| JP | 2006-190831 | 7/2006 |
| KR | 10-2004-0093404 | 11/2004 |

*Primary Examiner* — Matthew Reames
(74) *Attorney, Agent, or Firm* — Harness, Dickey & Pierce, P.L.C.

(57) ABSTRACT

A semiconductor device having an MOSFET serving as an element to be protected, and an electrostatic protection MOSFET element mounted on the same substrate is produced with the small number of steps while implementing a high protection ability. Low concentration regions and gate electrodes are formed and then an insulation film is formed on a whole surface. Then, etching is performed using a resist pattern as a mask to leave the insulation film in a region from a part of the gate electrode to a part of the low concentration region in each of regions A1 and A3, and on a side wall of the gate electrode in a region A2. Then, a high concentration ion implantation is performed using the gate electrodes and the insulation films as masks, and then a silicide layer is formed.

2 Claims, 9 Drawing Sheets

SEMICONDUCTOR DEVICE AND METHOD FOR MANUFACTURING THE SAME

CROSS REFERENCE TO RELATED APPLICATION

This Nonprovisional application claims priority under 35 U.S.C. §119(a) on Patent Application No. 2009-188925 filed in Japan on 18 Aug., 2009 the entire contents of which are hereby incorporated by reference.

BACKGROUND OF THE INVENTION

1. Field of the Invention

The present invention relates to a semiconductor device, and more particularly to a semiconductor device including a high-voltage MOSFET, a low-voltage MOSFET, and an electrostatic protection MOSFET. In addition, the present invention relates to a method for producing the semiconductor device.

2. Description of the Related Art

In general, a semiconductor IC (Integrated Circuit) is vulnerable to a surge voltage generated by an electrostatic discharge (ESD), and likely to be broken down. Therefore, a circuit for electrostatic protection is normally provided in the IC to protect the IC from the surge voltage.

A circuit for electrostatic protection using an MOSFET is proposed as one example. For example, according to a circuit example shown in FIG. 6, an N-type MOSFET 91 is provided as an electrostatic protection circuit, and it is connected to an internal circuit 92 to be protected in parallel. In the N-type MOSFET 91, a source and a gate are short-circuited, and an off state is maintained under the condition that a normal signal voltage Vin is applied to a signal line SE in a normal time. However, when an excessive voltage Vsur which is considerably higher than the Vin is applied to the signal line SE, a pn junction between a drain of the N-type MOSFET 91 and a substrate is inversely biased, and a breakdown is caused. At this time, collisional ionization is caused just under the drain, and many holes are generated, so that a potential of the substrate rises. At the same time, many electrons are diffused from the source to the substrate, and a diffusion current is generated. This diffusion current turns on a parasitic bipolar transistor in which the drain serves as a collector, the source serves as an emitter, and the semiconductor substrate serves as a base (snapback phenomenon). As a result, the excessive voltage Vsur applied to the drain can be discharged to a ground line VSS connected to the source through the parasitic bipolar transistor. Therefore, since a large current derived from the excessive voltage Vsur does not flow in the internal circuit 92, the internal circuit 92 can be protected.

An increase in parasitic resistance (contact resistance) due to a fine processing technology hinders the speeding up of the IC. As a measure of this, the parasitic resistance must be reduced by a salicide (Self Aligned Silicide) technology.

The salicide technology is a technology to form a thermally reactive layer (salicide) of metal and silicon on a source/drain region and a gate electrode of a MOSFET in a self-aligned manner. After reaction between metal and silicon, its resistance value can be lowered as compared with that of a normal silicon layer or polysilicon layer.

However, this salicide technology could adversely affect function fulfillment of the electrostatic protection circuit to implement electrostatic protection by use of the MOSFET provided after the snapback phenomenon.

FIG. 7 is a conceptual diagram showing a relationship between a drain voltage Vd and a drain current Id in an N-type MOSFET after broken down. As the drain voltage increases, the MOSFET is broken down at a breakdown voltage Va, and a parasitic bipolar transistor is turned on, that is, the snapback phenomenon occurs. At this time, a negative resistance region in which the drain voltage Vd and the drain current Id have a negative correlation is generated (refer to <I> in the drawing). Thus, after the snapback phenomenon, a resistance region in which the drain voltage Vd and the drain current Id have a positive correlation is formed (refer to <II> in the drawing).

When a silicide layer is not formed on the source/drain region, as shown by a solid line (a) in FIG. 7, a slope of Id-Vd curve is small in the positive resistance region. This is derived from a resistance component in the source/drain region. Meanwhile, when the silicide layer is formed on the source/drain region, a resistance value in this region is largely lowered. Therefore, as shown by a broken line (b), a slope of Id-Vd curve is steep as compared with the line (a).

Therefore, in the case where the silicide layer is formed in the source/drain region of the electrostatic protection MOSFET 91, when the excessive Vsur is applied to the signal line SE, and the snapback phenomenon is generated, a considerably large current flows in the MOSFET 91 because its resistance value is small as compared with the case where the silicide layer is not formed. Thus, considerably high Joule heat is generated, and the MOSFET 91 is likely to be broken down. Once the MOSFET 91 is broken down, it does not serve to protect the internal circuit 92 anymore. That is, the problem is that the protection function for the internal circuit 92 is lowered because the MOSFET 91 is likely to be broken down.

In addition, in a case of a structure in which a drift region is provided outside the gate electrode in a high-voltage MOSFET, since a resistance value of the drift region is lowered due to the silicide layer, the drift region does not serve to relax an electric field. Therefore, in the case where the salicide technology and the high-voltage MOSFET are combined, a structure in which the drift region is formed under the gate electrode, that is, "gate-overlap structure" has been conventionally used.

However, this structure has the problem that capacitance between the gate and drain, or capacitance between the gate and source increases, which is disadvantageous to the high-speed operation, or the problem that a leak current flowing from the drain to the substrate called a GIDL (Gate Induced Leakage) increases because a gate electrode edge comes close to a silicide region or to the high concentration source/drain region.

In order to solve the above problems, a high-voltage MOSFET in which the silicide layer is not formed in a predetermined region while the drift region is provided outside the gate electrode, is proposed (refer to Japanese Patent Application Laid-Open Publication No. Hei 5-3173 (hereinafter, referred to as the document 1), and Japanese Patent Application Laid-Open Publication No. 2004-47721 (hereinafter, referred to as the document 2), for example).

FIGS. 8A and 8B are schematic cross-sectional views of a semiconductor device disclosed in the document 1, showing cross-sectional views at certain steps in the middle of manufacturing process for convenience of description. Regions B1 and B2 each partitioned by an element isolation region 101 are formed on a semiconductor substrate 100, and a MOSFET 121 serving as an element to be protected is formed in the region B1, and an electrostatic protection MOSFET 122 is formed in the region B2.

As shown in FIG. 8A, in the MOSFET 121, silicide layers 107 and 108 are formed on an upper surface of a low concentration diffusion region 103 and on an upper surface of a gate electrode 105, respectively. In addition, a sidewall insulation film 106 is formed on side walls of the gate electrode 105 and the silicide layer 108. In addition, reference 104 represents a gate oxide film.

In the electrostatic protection MOSFET 122 also, silicide layers 117 and 118 are formed on an upper surface of a low concentration diffusion region 113, and on an upper surface of the gate electrode 115, respectively. However, it is to be noted that the diffusion region 113 is not completely covered with the silicide layer 117, and a part of the region on the side of the gate electrode 115 is not covered with the silicide layer 117. That is, a separation region (X1) is provided between the silicide layer 117 and the gate electrode 115 in a horizontal direction. In addition, reference 114 represents a gate oxide film, and a reference 116 represents a sidewall insulation film, in the MOSFET 122.

In order to implement the above configuration, an insulation film (silicide block) 120 is previously formed in a region in which the silicide layer 117 is not to be formed, in a stage before the silicide layer 117 is formed, and silicide is formed in this state. Thus, silicide can be formed only in a part of the diffusion region 113.

In addition, in actual steps, the silicide layer 108 and the silicide layer 118 are formed at the same time, and then the insulation film 120 is formed and then the silicide layer 107 and the silicide layer 117 are formed at the same time As one example, the silicide layer 108 and the silicide layer 118 are formed of tungsten silicide, and the silicide layer 107 and the silicide layer 117 are formed of titanium silicide.

Then, as shown in FIG. 8B, after removing the insulation film 120, a high concentration impurity ion implantation is performed to form high concentration diffusion regions (source/drain regions) 102 and 112, and to dope the gate electrodes 105 and 115 with an impurity. Thus, while the source/drain region 102 is completely covered with the silicide layer 107 in the MOSFET 121, the region (X1) which is not covered with the silicide layer 117 is provided in the source/drain region 112, in the MOSFET 122 serving as the protection element. Thus, the resistance value after the snapback phenomenon can be prevented from being considerably lowered.

FIGS. 9A and 9B are schematic cross-sectional views of a configuration disclosed in the document 2, showing cross-sectional views at certain steps in the middle of manufacturing process for convenience of description. In addition, an electrostatic protection MOSFET is only shown in FIGS. 9A and 9B.

An element isolation region 201, a gate oxide film 204, and a gate electrode 205 are formed on a semiconductor substrate 200, and then a low concentration ion implantation is performed. By this ion implantation, a low concentration region 202 is formed on the side of a source, and a low concentration region 203 serving as an LDD region is formed on the side of a drain. Then, a sidewall insulation film 208 is formed and then a high concentration ion implantation is performed using a resist pattern 220 as shown in FIG. 9A. By this ion implantation, a drain 206 is formed in the low concentration region 203 away from an edge of the gate electrode 205 by a distance X2 in a horizontal direction. At this time, a source 207 is formed and an impurity is doped into the gate electrode 205 in the same step.

Then, the resist pattern 220 is removed, and as shown in FIG. 9B, an insulation film 212 serving as a silicide block is formed using a patterning shape having openings in an upper surface of the drain 206, an upper surface of the source 207, and a part of an upper surface of the gate electrode 205, and then silicide is formed. Thus, silicide layers 209, 210, and 211 are formed on an upper layer of the drain 206, an upper layer of the source 207, and an upper layer of the gate electrode 205, respectively.

In this case also, similar to FIGS. 8A and 8B, since the diffusion region 203 which is not covered with the silicide layer is formed in the separation region X2, a resistance value after the snapback phenomenon is prevented from being largely lowered.

However, according to the method described in the document 1, it is necessary to form silicide in twice, and it is necessary to separately form the insulation film 120 for blocking silicide, so that the number of steps and manufacturing cost largely increase.

In addition, according to the method described in the document 2, it is necessary to separately form the insulation film 212 for blocking silicide, so that the number of steps and manufacturing cost largely increase. In addition, the insulation film 212 needs to be aligned so as not to cover the already formed drain region 206, that is, it is not formed in a self-aligned manner. Therefore, it is necessary to ensure an alignment margin for the alignment, which causes increase in transistor size.

SUMMARY OF THE INVENTION

The present invention has been made in view of the above problems, and it is an object of the present invention to provide a semiconductor device capable of being produced with the small number of steps while implementing a high protection ability, as for a semiconductor device having a MOSFET serving as an element to be protected and an electrostatic protection MOSFET mounted on the same substrate. Especially, the present invention is useful in implementing a semiconductor device having a high-voltage MOSFET and an electrostatic protection MOSFET mounted on a semiconductor substrate.

In order to attain the above object, a semiconductor device according to the present invention is a semiconductor device having a first MOSFET with a high withstand voltage, a second MOSFET with a low withstand voltage, and a third MOSFET for electrostatic protection mounted on the same semiconductor substrate, in which the first to third MOSFETs are formed in first to third regions defined by element isolation regions, respectively, the first region has a well region for the first MOSFET, a first low concentration diffusion region formed separately in a surface portion of the well region for the first MOSFET, a first gate electrode formed on the semiconductor substrate so as to be positioned over a separation region of the first low concentration diffusion region with a gate oxide film for a high voltage interposed therebetween, a first insulation film formed so as to overlap a region from a part of an upper part of the first gate electrode to a part of an upper part of the first low concentration diffusion region, a first high concentration diffusion region formed in a surface portion of the first low concentration diffusion region uncovered with the first insulation film, and first silicide layers each formed on an upper surface of the first gate electrode uncovered with the first insulation film and an upper surface of the first high concentration diffusion region, respectively, the second region has a well region for the second MOSFET, a second low concentration diffusion region formed separately in a surface portion of the well region for the second MOSFET, a second gate electrode formed on the semiconductor substrate so as to be positioned over a separation region of the second low concentration diffusion region with a gate oxide film for a low voltage interposed therebetween, a second insulation film formed on a side wall of the second gate electrode, a second high concentration diffusion region formed in a surface portion of the second low concentration diffusion region uncovered with the second insulation film, and second silicide layers each formed on an upper surface of the second gate electrode and an upper surface of the second high concentration diffusion region, respectively, and the third region has a well region for the third MOSFET, a third low concentration diffusion region formed separately in a surface portion of the well region for the third MOSFET, a third gate electrode formed on the semiconductor substrate so as to be positioned over a separation region of the third low concentration diffusion region with a gate oxide film interposed therebetween, a third insulation film formed so as to overlap a region from a part of an upper part of the third gate electrode to a part of an upper part of the third low concentration diffusion region, a third high concentration diffusion region formed in a surface portion of the third low concentration diffusion region uncovered with the third insulation film, and third silicide layers each formed on an upper surface of the third gate electrode uncovered with the third insulation film and an upper surface of the third high concentration diffusion region, respectively.

In the above configuration, the first to third insulation films can be formed in the same step, and these are produced in the normal step of forming a sidewall insulation film. In addition, when silicide is formed after forming the first to third insulation films, the insulation films serve as silicide blocks.

More specifically, according to the semiconductor device in the present invention, since the sidewall insulation film also functions as the silicide block, it is not necessary to separately form an insulation film for blocking silicide. Thus, the number of manufacturing steps can be reduced as compared with the conventional example.

Furthermore, the first to third high concentration diffusion regions are formed by the high concentration ion implantation using the first to third insulation films as masks. That is, the first to third high concentration diffusion regions serving as the source/drain regions are formed self-aligned manner by aligning the first to third insulation films when they are formed. Thus, since the number of factors which requires consideration of variations at the time of processing is reduced, an alignment margin to be ensured can be reduced.

At this time, since each of the first to third gate electrodes has the opening in a part of its upper part, the impurity can be doped into the gate electrode at the same time as the ion implantation to form the first to third high concentration diffusion regions.

In addition, as another configuration, the first insulation film is formed so as to overlap the region from a part of the upper part of the first gate electrode to a part of the upper part of the first low concentration diffusion region, only on one of left and right sides of the first gate electrode. This configuration can be flexibly applied to a case where the voltage application direction to the first MOSFET is fixed to one direction.

In addition, it is preferable that the impurity concentration of the first to third low concentration diffusion regions is sufficiently lower (by one or more digits, for example) than that of the first to third high concentration diffusion regions. In this case, since resistivity increases especially in the third low concentration diffusion region, even when the width of the third insulation film which overlaps the third low concentration diffusion region is decreased, a resistance value can be ensured to a certain extent. That is, the width of the third low concentration diffusion region can be shortened in the horizontal direction without causing a large current to flow in the snapback phenomenon, so that the device can be reduced in size.

According to the present invention, the semiconductor device can be produced with the small number of steps while implementing a high protection ability, without causing a considerably large current to be generated after the snapback phenomenon, in the semiconductor device having the MOSFET serving as the element to be protected and the electrostatic protection MOSFET mounted on the same substrate.

DETAILED DESCRIPTION OF THE INVENTION

Structure

Figure 1:
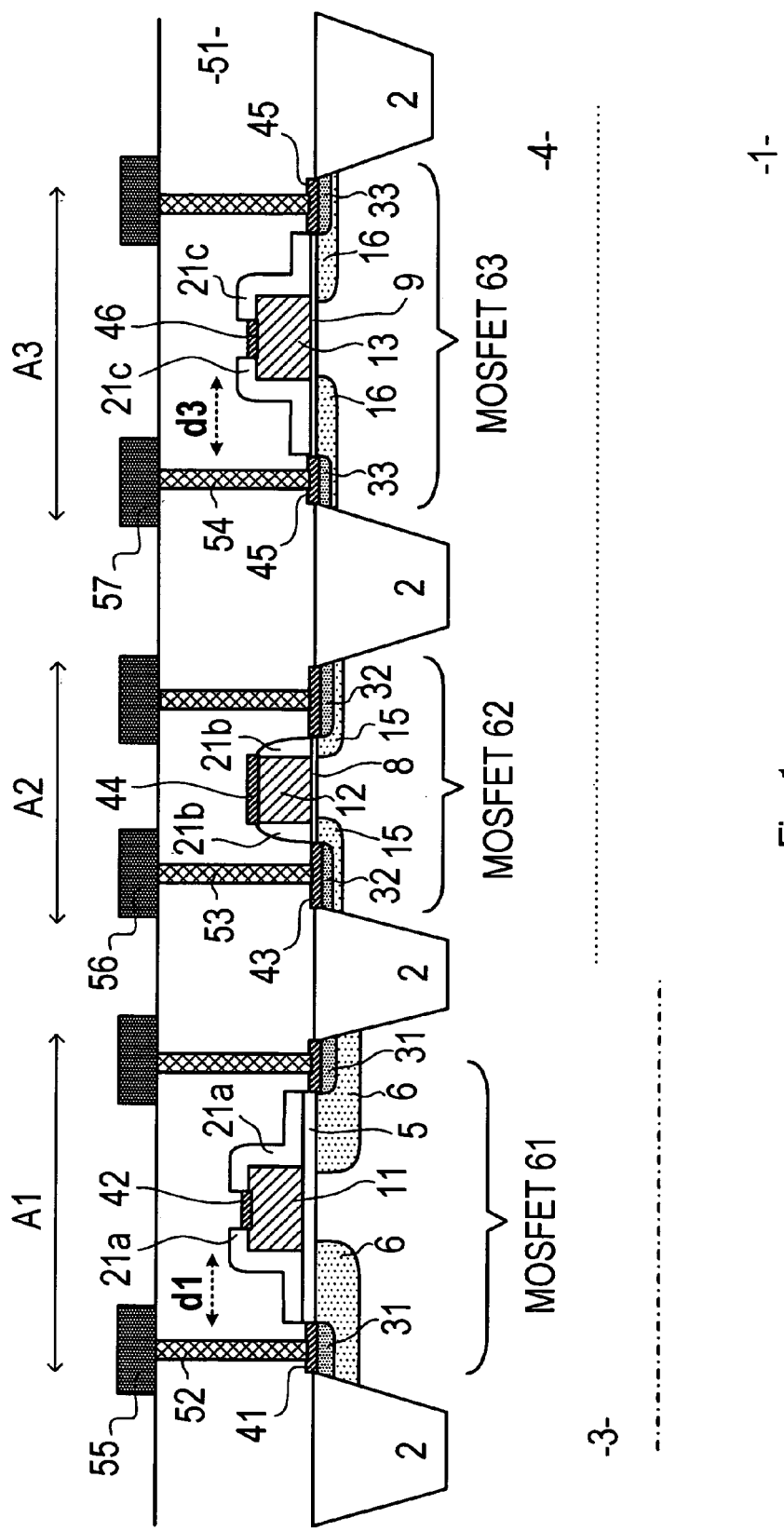
FIG. 1 is a schematic cross-sectional view of a semiconductor device according to the present invention.

FIG. 1 is a schematic cross-sectional view of a semiconductor device according to the present invention. This semiconductor device has three regions A1 to A3 on the same semiconductor substrate 1, and a different MOSFET is formed in each region. The region A1, the region A2, and the region A3 correspond to the first region, the second region, and the third region, respectively.

Thus, a high-voltage MOSFET 61, a low-voltage MOSFET 62, and a MOSFET 63 serving as an electrostatic protection element are formed in the region A1, the region A2, and the region A3, respectively. Hereinafter, the MOSFET serving as the electrostatic protection element is referred to as the "electrostatic protection MOSFET". The high-voltage MOSFET 61, the low-voltage MOSFET 62, and the electrostatic protection MOSFET 63 correspond to the first MOSFET, the second MOSFET, and the third MOSFET, respectively. In addition, it is assumed that each MOSFET is an N-type MOSFET here.

In this embodiment, the electrostatic protection MOSFET 63 serves as a protection element of the low-voltage MOSFET 62. That is, the electrostatic protection MOSFET 63 is also formed on a low-voltage P-type well 4 as with the low-voltage MOSFET 62.

The high-voltage MOSFET 61 is formed on a high-voltage P-type well 3. A low concentration N-type drift region 6 partially having a separation region is formed in a surface region of the P-type well 3. The drift region 6 corresponds to the first low concentration diffusion region.

In addition, the high-voltage MOSFET 61 has a gate electrode 11 on an upper surface of the P-type well 3 with a gate oxide film 5 interposed therebetween. The gate electrode 11 is formed so as to overlap a region sandwiched between the separated drift regions and a part of an upper part of the drift region 6. The gate electrode 11 corresponds to the first gate electrode.

A High concentration N-type source/drain region 31 is formed in a part of a surface region of the drift region 6 on the side of an element isolation region 2 which is the opposite to the gate electrode 11. A silicide layer 41 is formed on an upper surface of the source/drain region 31. The source/drain region 31 corresponds to the first high concentration diffusion region.

The high-voltage MOSFET 61 has an insulation film 21*a* which is formed so as to overlap a part of an upper surface of the gate electrode 11 and the upper part of the drift region 6 in which the source/drain region 31 is not formed. The insulation film 21*a* is formed on a side wall of the gate electrode 11 in a vertical direction, and also formed so as to extend to some extent in a horizontal direction parallel to the semiconductor substrate 1. A horizontal separation d1 is ensured between the gate electrode 11 and the silicide layer 41 formed on the source/drain region 31 by the insulation film 21*a*.

Thus, the insulation film 21*a* does not cover the whole upper surface of the gate electrode 11, and it is only formed on a region having a certain width from an edge thereof, and it is not formed in the center thereof. A silicide layer 42 is formed on the upper surface of the gate electrode 11 in which the insulation film 21*a* is not formed, and contributes to reduction in contact resistance. In addition, each of the silicide layers 41 and 42 corresponds to the first silicide layer, and the insulation film 21*a* corresponds to the first insulation film.

The drift region 6 is formed in the high concentration MOSFET 61 to exert a field relaxation effect, but in order to exert this effect, it is necessary to provide a certain horizontal separation between a lower part of the gate electrode 11 and the source/drain region 31. In the configuration shown in FIG. 1, the drift region 6 formed in the separation region (d1) prevents a high electric field from being generated between the source/drain region 31 and the gate electrode 11.

However, when the silicide layer 41 is formed on an upper surface of the drift region 6 in this separation region, that is, the source/drain region 31 and the drift region 6 are formed under the same silicide layer 41, there is almost no difference in potential between them in this area after all the separation is provided. This means that the function of the drift region 6 to relax an electric field between the source/drain region 31 and the gate electrode 11 cannot be sufficiently fulfilled in this case.

Therefore, in the semiconductor device according to the present invention, as shown in FIG. 1, the silicide layer 41 is not formed on the upper surface of the drift region 6 in which the source/drain region 31 is not formed, and the insulation film 21*a* is formed instead.

Thus, an interlayer insulation film 51 is formed so as to cover the gate electrode 11, the insulation film 21*a*, and the silicide layers 41 and 42, and a contact electrode 52 is formed in the interlayer insulation film 51 to be electrically connected to the silicide layer 41 on the source/drain region 31. A wiring layer 55 is formed so as to be electrically connected to the contact electrode 52, on an upper layer of the interlayer insulation film 51. In addition, a contact electrode to be electrically connected to the silicide layer 42 on the gate electrode 11 is formed in another position although it is not shown.

The low-voltage MOSFET 62 is formed on the low-voltage P-type well 4 in the region A2. A low concentration N-type LDD region 15 partially having a separation region is formed in a surface region of the P-type well 4. The LDD region 15 corresponds to the second low concentration diffusion region.

The low-voltage MOSFET 62 has a gate electrode 12 on an upper surface of the P-type well 4 with a low-voltage gate oxide film 8 interposed therebetween. The gate electrode 12 is formed so as to overlap a region sandwiched between the separated low concentration LDD regions 15, and a part of an upper part of the low concentration LDD region 15. The gate electrode 12 corresponds to the second gate electrode.

A high concentration N-type source/drain region 32 is partially formed in a surface region of the low concentration LDD region 15 on the side of an element isolation region 2 which is opposite to the gate electrode 12. A silicide layer 43 is formed on an upper surface of the source/drain region 32. In addition, a silicide layer 44 is formed on an upper surface of the gate electrode 12. The source/drain region 32 corresponds to the second high concentration diffusion region, and the silicide layers 43 and 44 corresponds to the second silicide layers.

The low-voltage MOSFET 62 has an insulation film 21*b* on a side wall surface of the gate electrode 12. The insulation film 21*b* is formed so as to overlap the upper part of the low concentration LDD region 15 in which the source/drain region 32 is not formed. Here, it is to be noted that the insulation film 21*b* less extends in the horizontal direction as compared with the insulation film 21*a* formed in the high-voltage MOSFET 61. That is, the insulation film 21*b* is hardly or not formed on the upper surface of the gate electrode 12, and less extends in the horizontal direction even at the level of the contact area between the insulation film 21*b* and the gate oxide film, as compared with the insulation film 21*a*. The insulation film 21*b* corresponds to the second insulation film.

The LDD region 15 is also formed in the low-voltage MOSFET 62 to prevent a high electric field from being generated between the gate electrode 12 and the source/drain region 32, as with the drift region 6 formed in the high concentration MOSFET 61. However, the low-voltage MOSFET 62 requires a lower withstand voltage than that of the high-voltage MOSFET 61. Therefore, in the low-voltage MOSFET 62, a horizontal separation distance between the gate electrode and the source/drain region is shorter than that of the high-voltage MOSFET 61, with a view to reducing an occupied area. Thus, in the low-voltage MOSFET 61, the separation is ensured by the insulation film 21*b* formed on the side wall of the gate electrode 12.

The interlayer insulation film 51 is formed so as to cover the gate electrode 12, the insulation film 21*b*, and silicide layers 43 and 44, and a contact electrode 53 is formed so as to be electrically connected to the silicide layer 43 on the source/drain region 32, in the interlayer insulation film 51. Then, a wiring layer 56 is formed on the upper layer of the interlayer insulation film 51 so as to be electrically connected to the contact electrode 53. In addition, a contact electrode to be electrically connected to the silicide layer 44 on the gate electrode 12 is formed in another position although it is not shown.

The low-voltage electrostatic protection MOSFET 63 is formed on the low-voltage P-type well 4 in the region A3. A low concentration N-type LDD region 16 partially having a separation region is formed in the surface region of the P-type well 4. The LDD region 16 corresponds to the third low concentration diffusion region.

The electrostatic protection MOSFET 63 has a gate electrode 13 on the upper surface of the P-type well 4 with a low-voltage gate oxide film 9 interposed therebetween. The gate electrode 13 is formed so as to overlap a region sandwiched between the separated low concentration LDD regions 16, and a part of an upper part of the low concentration LDD region 16. The gate electrode 13 corresponds to the third gate electrode.

A high concentration N-type source/drain region 33 is formed in a part of a surface region of the low concentration LDD region 16 on the side of the element isolation region 2 which is opposite to the gate electrode 13. A silicide layer 45 is formed on an upper surface of the source/drain region 33. The source/drain region 33 corresponds to the third high concentration diffusion region.

The electrostatic protection MOSFET 63 has an insulation film 21c which is formed so as to overlap a part of an upper surface of the gate electrode 13 and the upper part of the low concentration LDD region 16 in which the source/drain region 33 is not formed. The insulation film 21c is formed on a side wall of the gate electrode 13 in the vertical direction, and also formed so as to extend to some extent in a horizontal direction parallel to the semiconductor substrate 1. A horizontal separation d3 is ensured between the gate electrode 13 and the silicide layer 45 on the source/drain region 33 by the insulation film 21c.

As described above, in the electrostatic protection MOSFET, when the silicide layer is formed in the diffusion region, the resistance value of the parasitic transistor after the snapback phenomenon is considerably lowered, so that it is easily broken down when the excessive voltage is applied. Therefore, in the semiconductor device according to the present invention, the low concentration LDD region 16 serving as the diffusion region in the region A3 does not have the silicide layer 45 between the source/drain region 33 and the gate electrode 13, that is, in the separation region d3. Thus, a resistance value after the snapback phenomenon is prevented from being considerably lowered.

The insulation film 21c does not completely cover the upper surface of the gate electrode 13, and it is only formed in a region having a certain width from an edge thereof, and not formed in the center thereof. A silicide layer 46 is formed on the upper surface of the gate electrode 13 in which the insulation film 21c is not formed. In addition, the silicide layers 45 and 46 correspond to the third silicide layers, and the insulation film 21c corresponds to the third insulation film.

The interlayer insulation film 51 is formed to cover the gate electrode 13, the insulation film 21c, and the silicide layers 45 and 46, and a contact electrode 54 is formed in the interlayer insulation film 51 to be electrically connected to the silicide layer 45 on the source/drain region 33 in the interlayer insulation film 51. A wiring layer 57 which is electrically connected to the contact electrode 54 is formed on the upper layer of the interlayer insulation film 51. In addition, a contact electrode to be electrically connected to the silicide layer 46 on the gate electrode 13 is formed in another position although it is not shown. In addition, the gate electrode 13 is electrically connected to one diffusion region (source) of the source/drain region 33 so that the electrostatic protection MOSFET 63 is in off state in a normal time According to the configuration shown in FIG. 1, the high-voltage MOSFET 61 implements a high withstand voltage as compared with the low-voltage MOSFET 62, and the electrostatic protection MOSFET 63 can protect the low-voltage MOSFET 62 from an excessive voltage without being easily broken down. Thus, as will be described below, since the insulation films 21a, 21b, and 21c can be all formed in the same step, it is not necessary to separately add a step of forming an insulation film serving as a silicide block. In addition, since the silicide layers 41 to 46 are all formed in the same step, it is not necessary to separately form the silicide layer on the upper layer of the gate electrode, and the silicide layer on the upper layer of the source/drain region. Therefore, the semiconductor device can be manufactured with the considerably small number of steps as compared with the conventional technique.

Furthermore, the insulation films 21a, 21b, and 21c function as masks for forming the source/drain regions 31, 32, and 33, respectively. Thus, by aligning resist patterns when the insulation films 21a, and 21c are formed, the source/drain regions are formed in a self-aligned manner. Thus, the number of factors which requires consideration of a variation at the time of processing is reduced as compared with the conventional technique, so that an alignment margin to be ensured can be reduced. Hereinafter, the insulation films 21a, 21b, and 21c are collectively referred to as the "mask insulation film" occasionally.

In addition, while the description has been made of the case where the N-type MOSFET is formed on the P-type semiconductor substrate 1 in FIG. 1, a description can be similarly made of a case where a P-type MOSFET is formed, by reversing a conductivity type of each impurity ion.

Manufacturing Method

A description will be made of a method for producing the semiconductor device with reference to process cross-sectional views schematically shown in FIGS. 2A to 2D to FIGS. 4A to 4C. In addition, the process cross-sectional views are composed of three drawings, due to space limitation. In addition, steps numbers #1 to #15 are allocated to the steps for convenience of the description.

Figure 2A:
FIGS. 2A to 2D are process cross-sectional views showing manufacturing steps of the semiconductor device according to the present invention.

First, as shown in FIG. 2A, the element isolation regions 2 each having a depth of about 0.3 to 1.0 μm are formed in the P-type semiconductor substrate 1 by the well-known STI (Shallow Trench Isolation) technique (step #1). Thus, active regions are defined by the element isolation regions 2.

The semiconductor device according to the present invention is composed of the three elements such as the high-voltage MOSFET, the low-voltage MOSFET, and the MOSFET serving as the electrostatic protection element (hereinafter, referred to as the electrostatic protection MOSFET) which are formed on the same substrate. Therefore, at least three active regions are formed in the step #1. FIG. 2A shows the three active regions formed in the regions A1, A2, and A3, respectively.

In addition, according to this embodiment, the region A1 is for the high-voltage MOSFET, the region A2 is for the low-voltage MOSFET, and the region A3 is for the electrostatic protection MOSFET. That is, the active regions formed in the regions A1 to A3 are used as the active regions of the MOSFETs formed in the respective regions.

Figure 2B:
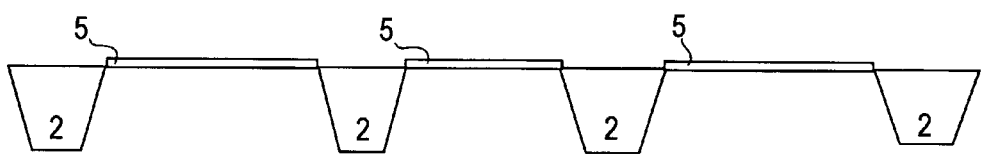

Then, as shown in FIG. 2B, the P-type well 3 for the high voltage is formed in the region A1, and the P-type well 4 for the low voltage is formed in the regions A2 and A3 (step #2). More specifically, each well is formed by a P-type impurity ion (B ion, for example) implantation and a heat treatment. The P-type well 4 is formed by the ion implantation in the regions A2 and A3 at the same time and shared by the low-voltage MOSFET and the electrostatic protection MOSFET. Then, the high-voltage gate oxide film 5 having a thickness of 30 to 60 nm is formed on a whole surface by a thermal oxidization method or a CVD method (step #3).

Figure 2C:
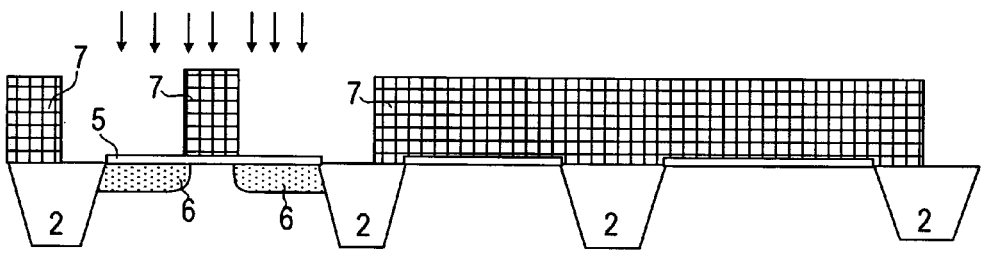

Then, as shown in FIG. 2C, the drift region 6 for the high-voltage MOSFET is formed by an ion implantation in a part of the surface of the well 3 for the high voltage (step #4). More specifically, a resist pattern 7 is formed on a region in which the ion implantation is not to be performed, that is, a whole surface of the regions A2 and A3 and a part of the region A1, and then the N-type impurity ions (P ions, for example) are implanted with a dose amount of $5 \times 10^{12}$ ions/$cm^2$ at an implantation energy of 100 keV. Then, the resist pattern 7 is removed.

Figure 2D:
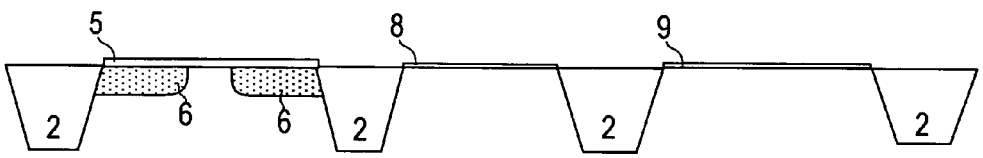

Then, as shown in FIG. 2D, the high-voltage gate oxide film 5 on the low-voltage well 4 is removed (step #5), and then the low-voltage gate oxide film having a thickness of 7 nm is formed on that region by a thermal oxidation method (step #6). More specifically, the low-voltage gate oxide film 8 is formed in the region A2, and the gate oxide film 9 is formed in the region A3.

Figure 3A:
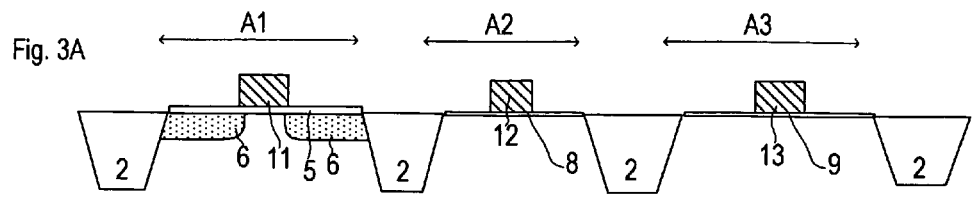
FIGS. 3A to 3D are process cross-sectional views showing manufacturing steps of the semiconductor device according to the present invention.

Then, as shown in FIG. 3A, the gate electrodes 11, 12, and 13 are formed of polysilicon in the predetermined region on the gate oxide film 5 in the region A1, in the predetermined region on the gate oxide film 8 in the region A2, and the predetermined region on the gate oxide film 9 in the region A3, respectively (step #7). More specifically, they are formed by etching after the polysilicon film has been formed on the whole surface.

Figure 3B:
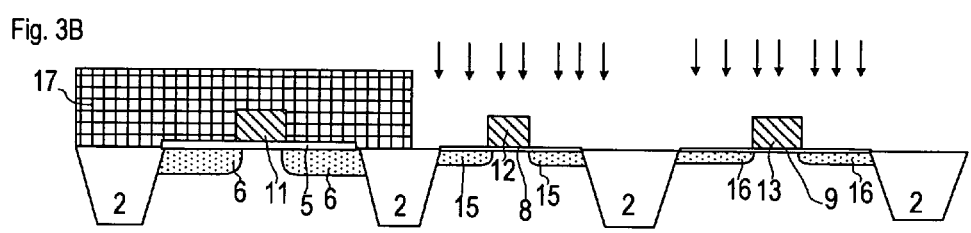

Then, as shown in FIG. 3B, the low concentration LDD region 15 for the low-voltage MOSFET, and the LDD region 16 for the electrostatic protection MOSFET are formed by an ion implantation in a part of the surface of the low-voltage well 4 (step #8). More specifically, a resist pattern 17 is formed on a region in which the ion implantation is not to be performed, that is, the whole surface of the region A1, and then the N-type impurity ions (P ions, for example) are implanted with a dose amount of $2 \times 10^{13}$ ions/$cm^2$ at an implantation energy of 20 keV. Since the gate electrodes 12 and 13 are formed on the low-voltage well 4, the gate electrodes serve as masks, so that the ions are not implanted into a lower part of the gate electrode, but implanted into the outer sides thereof.

Figure 3C:
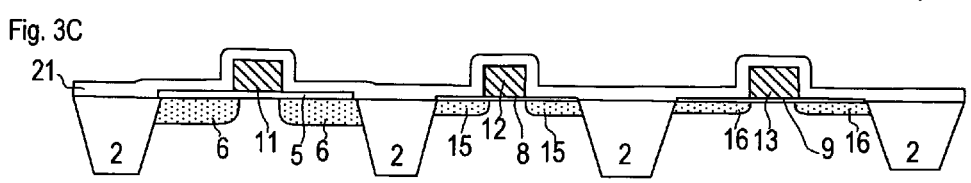

Then, as shown in FIG. 3C, an insulation film 21 is formed on the whole surface (step #9). More specifically, the insulation film is formed of SiN or $SiO_2$ and grown so as to have a thickness of about 100 nm by the CVD method. The insulation film 21 corresponds to the mask insulation film, and by shaping the insulation film 21 in the following steps, the first insulation film 21a of the MOSFET 61, the insulation film 21b of the MOSFET 62, and the insulation film 21c of the MOSFET 63 are formed.

Figure 3D:
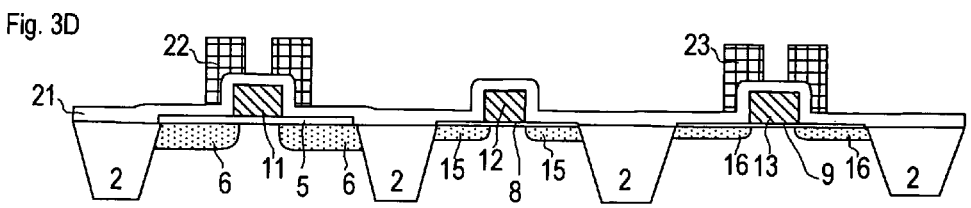

Then, as shown in FIG. 3D, resist patterns 22 and 23 are formed in the predetermined regions in the regions A1 and A3, respectively (step #10). At this time, the resist pattern 22 is formed so as to overlap a region from a part of the upper part of the gate electrode 11 to a part of the upper part of the drift region 6, in the region A1. Similarly, the resist pattern 23 is formed so as to overlap a region from a part of the upper part of the gate electrode 13 to a part of the upper part of the low concentration LDD region 16, in the region A3.

That is, in the step #10, the resist pattern 22 is not formed in the upper part of the center of the gate electrode 11, and in a part of the insulation film 21 above the drift region 6 on the side of the element isolation region 2 which is opposite to the gate electrode 11, in the region A1. In addition, the resist pattern 23 is not formed in an upper part of the center of the gate electrode 13, and in a part of the insulation film 21 above the low concentration LDD region 16 on the side of the element isolation region 2 which is opposite to the gate electrode 13, in the region A3.

Figure 4A:
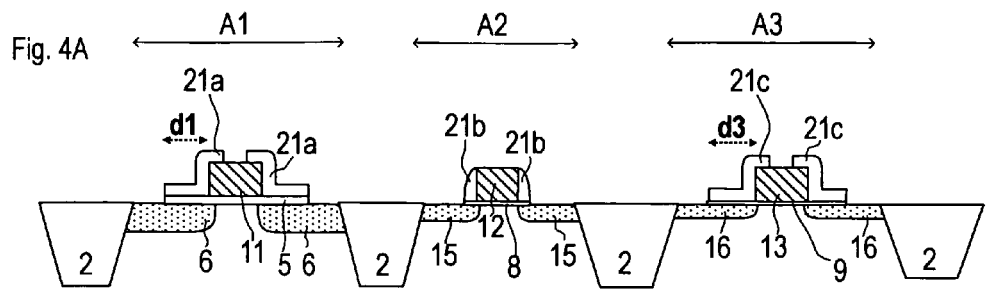
FIGS. 4A to 4C are process cross-sectional views showing manufacturing steps of the semiconductor device according to the present invention.

In this state, the insulation film 21 is etched by anisotropic dry etching (such as RIE: Reactive Ion Etching) (step #11). Thus, as shown in FIG. 4A, in the region A1, the insulation film 21a covered with the resist pattern 22 remains and the other part thereof is removed. In the region A2, the insulation film 21b remains on the side wall of the gate electrode 12, and the other part thereof is removed. In the region A3, the insulation film 21c covered with the resist pattern 23 remains, and the other part thereof is removed. In addition, the insulation film 21 formed on the element isolation region 2 is also removed.

In this step, in the region A1, the section having the width of d1 in the horizontal direction is formed in a part of the drift region 6 on which the insulation film 21a is formed. Similarly, in the region A3, the section having the width of d3 in the horizontal direction is formed in the LDD region 16 on which the insulation film 21c is formed. The insulation films 21a and 21c function to prevent silicide from being formed on the drift region 6 and the LDD region 16 covered with the insulation films, respectively, in steps of forming silicide (steps #13 to #14) as will be described below. Furthermore, in a step (step #12) of the high concentration impurity ion implantation as will be described below, they function also as masks when the source/drain regions are formed in the regions A1 and A3.

Meanwhile, in the region A2, the section in the LDD region 15 on which the insulation film 21b is formed has a width corresponding to the film thickness of the insulation film 21b remaining as the side wall insulation film on the side wall of the gate electrode 12, and this width is considerably smaller than the widths d1 and d3. Therefore, in the step for forming silicide to be described below, silicide is formed in almost the whole LDD region 15. In addition, the insulation film 21b serves as a mask in the high concentration impurity ion implantation step to form the source/drain regions, similar to the insulation films 21a and 21c.

In addition, in the regions A1 and A3, each of the insulation films 21a and 21c has an opening partially provided in its upper part of the gate electrode. Therefore, when the source/drain regions are formed in the following step #12, an impurity is doped into these gate electrodes 11 and 13 at the same time. In the region A2 in which the insulation film 21b is not formed on the upper surface of the gate electrode, the impurity can be doped in the gate electrode 12 as a matter of course.

In addition, in the step #11 of etching the insulation film 21, the gate oxide films 5, 8, and 9 are also etched. Thus, as shown in FIG. 4A, after the step #11, the gate oxide films only remain under the insulation films (21a, 21b, and 21c) and the gate electrodes (11, 12, and 13). That is, the gate oxide films (5, 8, and 9) formed on the diffusion regions (6, 15, and 16) are removed under the area in which the insulation film 21 was etched away, in this step.

Figure 4B:
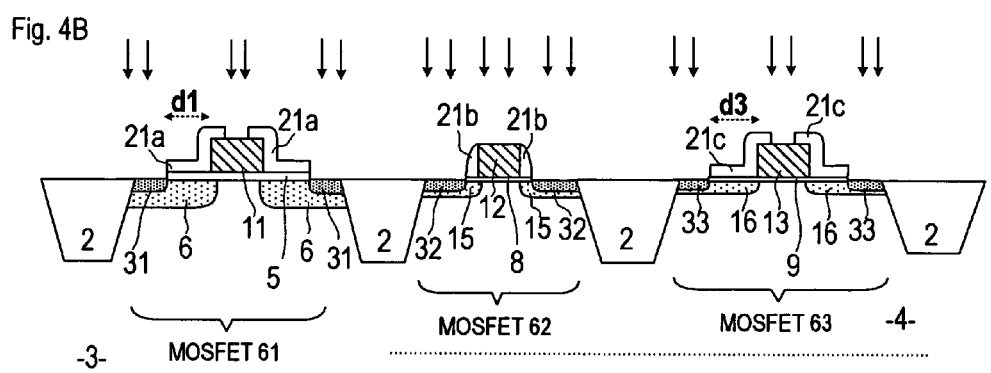

Then, as shown in FIG. 4B, the ion implantation is performed into the surface in the regions A1, A2, and A3, to form the source/drain regions 31, 32, and 33 of the respective MOSFETs, respectively (step #12). More specifically, N-type impurity ions (such As ions) are implanted with a dose amount of $5 \times 10^{15}$ ions/$cm^2$ at an implantation energy of 40 keV.

At this time, in the region A1, the gate electrode 11 and the insulation film 21a serve as masks, and the source/drain region 31 is formed in the surface region of the drift region 6 positioned outside the gate electrode 11 and the insulation film 21a. In the region A2, the gate electrode 12 and the insulation film 21b formed on its side wall serve as masks, and the source/drain region 32 is formed in the surface region of the low concentration LDD region 15 positioned outside the gate electrode 12 and the insulation film 21b. In the region A3, the gate electrode 13 and the insulation film 21c serve as masks, and the source/drain region 33 is formed in the surface region of the low concentration LDD region 16 positioned outside the gate electrode 13 and the insulation film 21c.

In addition, as described above, in this step #12, the impurity is doped into each of the gate electrodes 11, 12, and 13, at the same time.

Then, the silicide layer is formed on each exposed upper surface of the gate electrodes 11, 12, and 13, and each exposed upper surface of the source/drain regions 31, 32, and 33. More specifically, a high dielectric metal film such as Ti or Co is formed on the whole surface by a sputtering method or CVD method (step #13). Then, a heat treatment such as RTA (Rapid Thermal Annealing) is performed (step #14).

As described above, in the etching step in the step #11, the gate oxide films (5, 8, and 9) formed on the diffusion regions (6, 15, and 16) on which the insulation film 21 is not formed are removed, respectively. Therefore, the silicon substrate (active region) in these areas are exposed, so that this substrate surface can be in contact with the metal film formed in the step #13. In addition, the exposed upper surface of the gate electrode is also in contact with this metal film. Thus, by performing the heat treatment in the step #14, silicide is formed in the contact region between the metal film and the silicon substrate, and in the contact region between the metal film and the polysilicon film (gate electrode).

Figure 4C:
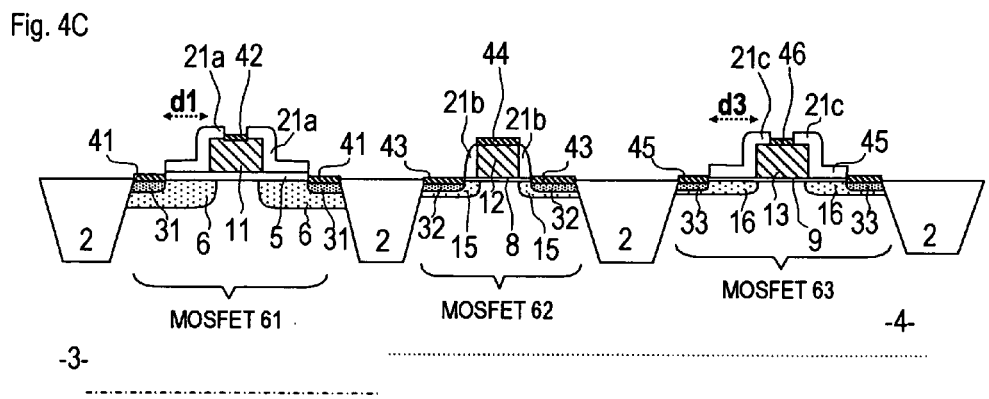

Meanwhile, the metal film formed on the insulation film does not react in the heat treatment and remains. This unreacted metal film is selectively removed by a chemical treatment using $H_2SO_4$, $H_2O_2$, or the like (step #15). Thus, as shown in FIG. 4C, the silicide layers 41 and 42 are formed in the region A1, the silicide layers 43 and 44 are formed in the region A2, and the silicide layers 45 and 46 are formed in the region A3.

A more specific description will be made below. In the region A1, the silicide layer 41 is formed on the upper surface of the source/drain region 31 on which the insulation film 21a is not formed, and the silicide layer 42 is formed in the upper surface of the gate electrode 11 on which the insulation film 21a is not formed. Meanwhile, the silicide layer is not formed on the drift region 6 in the region d1 on which the insulation film 21a is formed because the insulation film 21a functions as the silicide block.

In the region A2, the silicide layer 43 is formed on the upper surface of the source/drain region 32 on which the insulation film 21b is not formed, and the silicide layer 44 is formed on the upper surface of the gate electrode 12. In the region A2, the section in the LDD region 15 on which the insulation film 21b is formed has the width corresponding to the film thickness of the insulation film 21b remaining as the sidewall insulation film on the side wall of the gate electrode 12, and the width is shorter than that of the insulation film 21a. That is, in the region A2, the silicide layer 43 is formed almost all over the active region. In addition, since there is almost no insulation film 21b formed on the upper surface of the gate electrode 12, the silicide layer is formed almost all over the upper surface of the gate electrode 12.

In the region A3, the silicide layer 45 is formed on the upper surface of the source/drain region 33 on which the insulation film 21c is not formed, and the silicide layer 46 is formed on the upper surface of the gate electrode 13 on which the insulation film 21c is not formed. Meanwhile, the silicide layer is not formed on the drift region 16 in the region d3 on which the insulation film 21c is formed because the insulation film 21c functions as the silicide block.

Then, the interlayer insulation film 51 is formed by the well-known method, and then the contact plugs 52, 53, and 54, and the wiring layers 55, 56, and 57 are formed of high dielectric metal such as W. Thus, the semiconductor device shown in FIG. 1 is formed through the above steps.

Other embodiments will be described below.

(1) While the description has been made of the case where the high-voltage MOSFET, the low-voltage MOSFET, and the electrostatic protection MOSFET to protect the low-voltage MOSFET are mounted on the same substrate in the above embodiment, the same method may be applied to a case where an electrostatic protection MOSFET to protect the high-voltage MOSFET is mounted.

(2) It is assumed that a voltage application direction is not limited in the high-voltage MOSFET 61 in the above embodiment. However, even when the voltage application direction is limited to one direction, the same steps may be applied.

Figure 5:
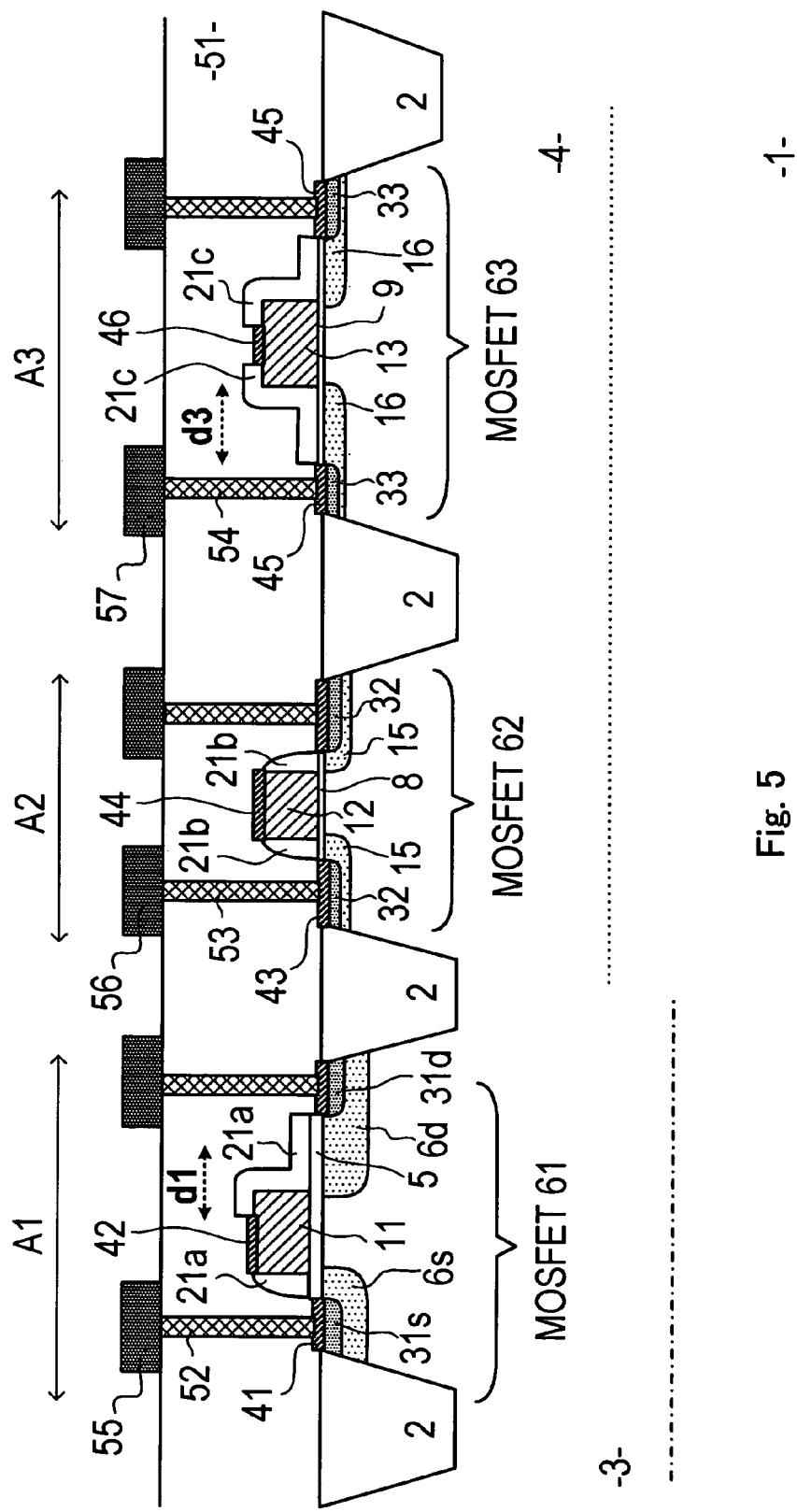
FIG. 5 is a schematic cross-sectional view of another semiconductor device according to the present invention.
Figure 6:
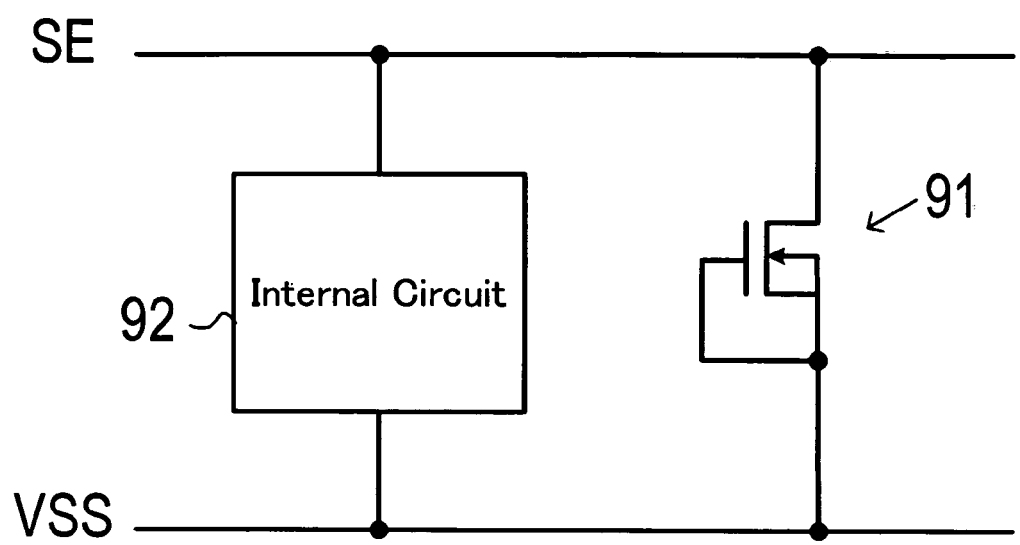
FIG. 6 is a circuit example including an electrostatic protection circuit.
Figure 7:
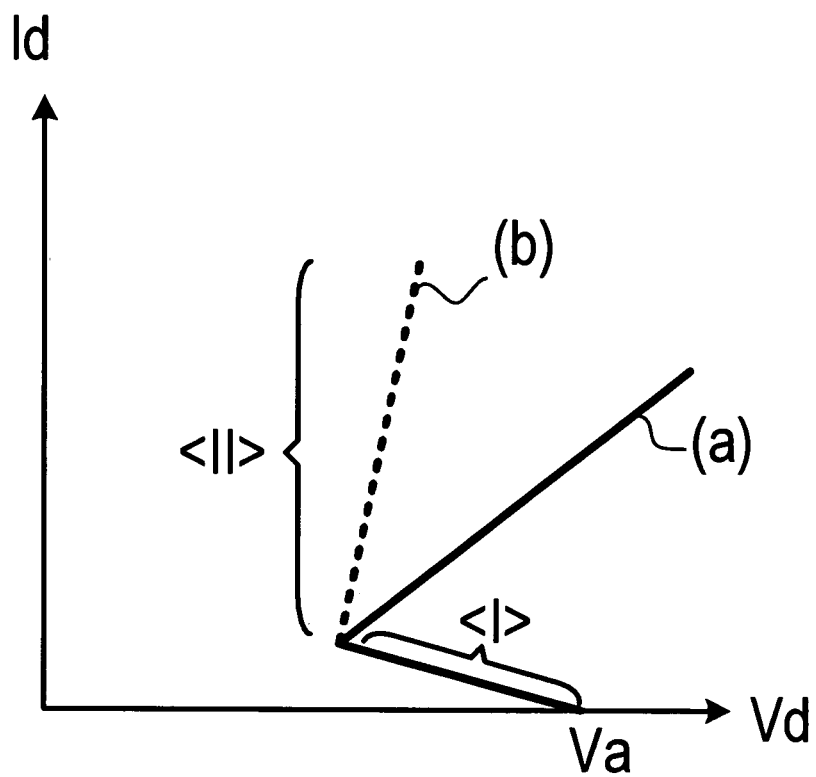
FIG. 7 is a conceptual diagram showing a relationship between a drain voltage Vd and a drain current Id in an N-type MOSFET after breakdown.
Figure 8A:
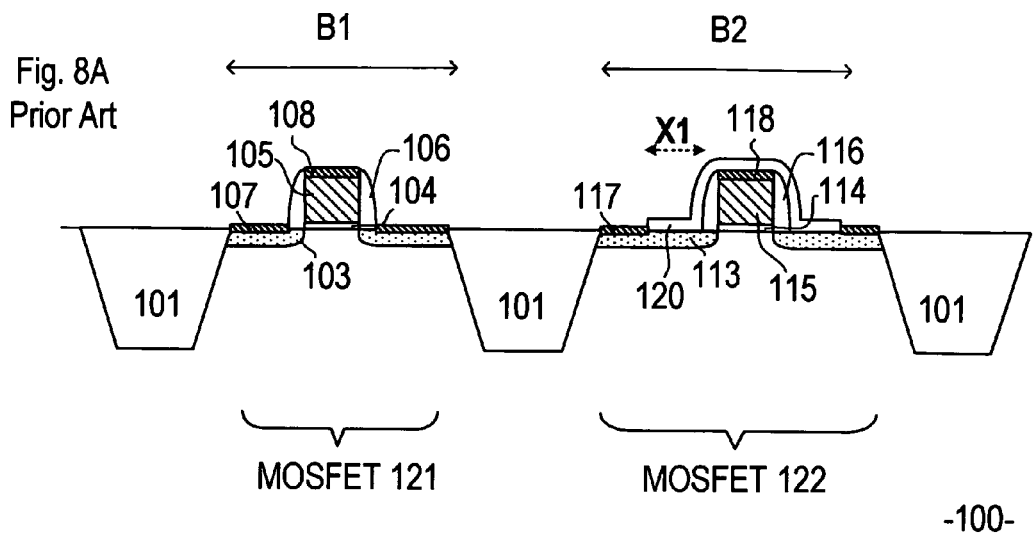
FIGS. 8A and 8B are schematic cross-sectional views of a conventional semiconductor device.
Figure 8B:
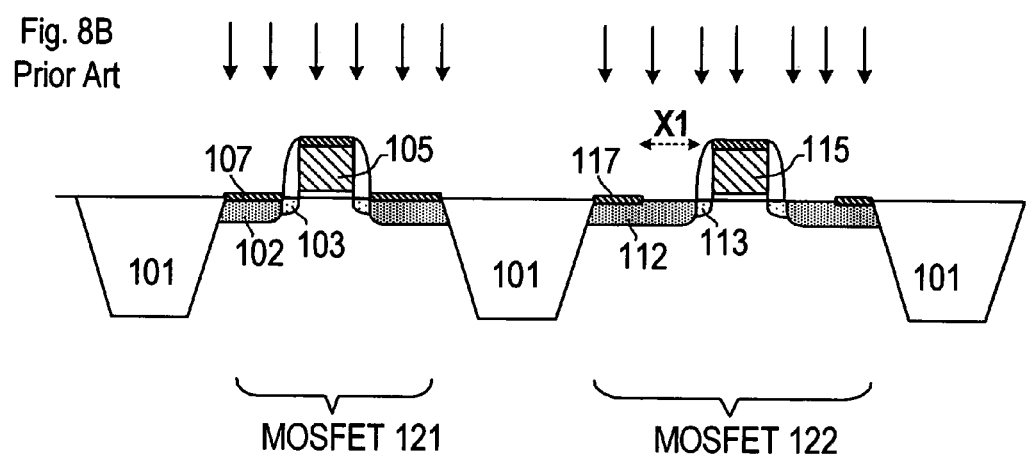
Figure 9A:
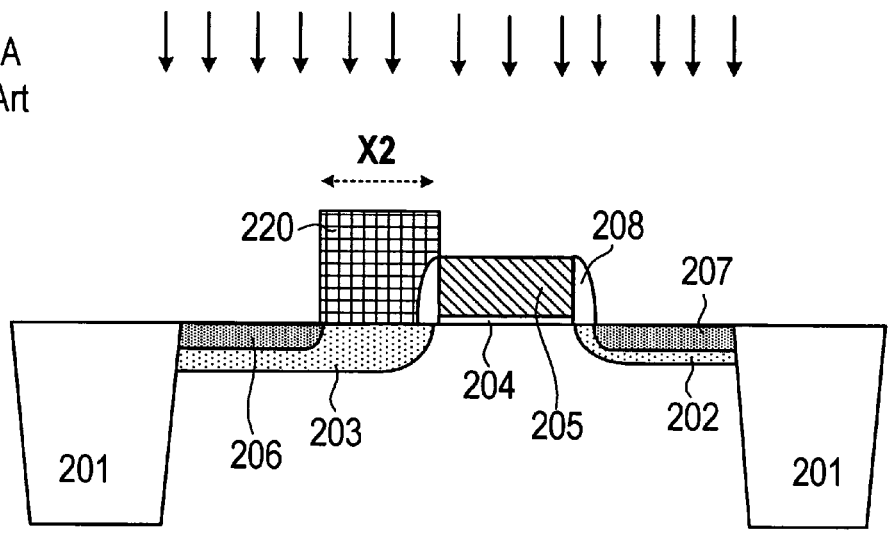
FIGS. 9A and 9B are schematic cross-sectional views of another conventional semiconductor device.
Figure 9B:
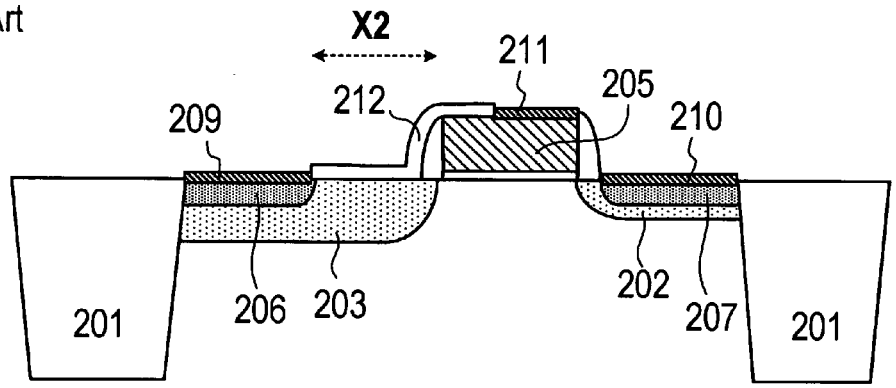

FIG. 5 shows a configuration example of the above semiconductor device. The insulation film 21a has a different shape as compared with that shown in FIG. 1. On the side of a drain 31d, the insulation film 21a is formed so as to overlap a part of an upper surface of the gate electrode 11 and an upper part of a drift region 6d on which the drain 31d is not formed, like in the case shown in FIG. 1. On the other hand, the insulation film 21a is only formed on the side wall of the gate electrode 11 as the sidewall insulation film like in the region A2.

The configuration shown in FIG. 5 can be formed by the same method as described in the above embodiment except for forming the resist pattern 22 to cover only the side of the drain 31d in the step #10.

In this case, the diffusion region serving as the drain, and the diffusion region serving as the source are fixed. Since the voltage resistance becomes problematic on the drain side, it is not necessary to ensure the width of the drift region for relaxing the high electric field on the side of the source as compared with the side of the drain Therefore, a device size can be miniaturized as compared with that shown in FIG. 1.

Although the present invention has been described in terms of a preferred embodiment, it will be appreciated that various modifications and alterations might be made by those skilled in the art without departing from the invention. The invention should therefore be measured in terms of the claims which follow.

What is claimed is:

1. A method for manufacturing a semiconductor device having a first MOSFET with a high withstand voltage, a second MOSFET with a low withstand voltage, and a third MOSFET for electrostatic protection mounted on the same semiconductor substrate, comprising:

defining a first region for forming the first MOSFET, and a second region for forming the second MOSFET, and a third region for forming the third MOSFET by forming element isolation regions in the semiconductor substrate;

forming a well region for the first MOSFET, a first low concentration diffusion region in a predetermined surface portion of the well region for the first MOSFET, and a first gate electrode on the semiconductor substrate with a gate oxide film for a high voltage interposed therebetween, in the first region;

forming a well region for the second MOSFET, a second low concentration diffusion region in a predetermined surface portion of the well region for the second MOSFET, and a second gate electrode on the semiconductor substrate with a gate oxide film for a low voltage interposed therebetween, in the second region;

forming a well region for the third MOSFET, a third low concentration diffusion region in a predetermined surface portion of the well region for the third MOSFET, and a third gate electrode on the semiconductor substrate with a gate oxide film interposed therebetween, in the third region;

forming a mask insulation film on a whole surface after the first to third gate electrodes and the first to third low concentration diffusion regions have been formed;

forming a resist pattern so as to overlap a region from a part of an upper part of the first gate electrode to a part of an upper part of the first low concentration diffusion region in the first region, and overlap a region from a part of an upper part of the third gate electrode to a part of an upper part of the third low concentration diffusion region in the third region;

etching the mask insulation film anisotropically using the resist pattern as a mask, to leave the mask insulation film in regions covered with the resist pattern in the first region and the third region, and in a side wall part of the second gate electrode in the second region;

performing a high concentration ion implantation using the remaining mask insulation film and the first to third gate electrodes as masks, to form first to third high concentration diffusion regions in surfaces of the first to third low concentration diffusion regions uncovered with the mask insulation film, respectively, and to dope the first to third gate electrodes;

forming a high melting point metal film on a whole surface and performing a heat treatment to form silicide layers on upper surfaces of the first to third high concentration diffusion regions, on upper surfaces of the first and the third gate electrodes uncovered with the mask insulation film, and on an upper surface of the second gate electrode; and selectively removing the unreacted high melting point metal film remaining on the mask insulation film and the element isolation regions; wherein the well region for the second MOSFET and the well region for the third MOSFET are formed in the same step, the second low concentration diffusion region for the second MOSFET and the third low concentration diffusion region for the third MOSFET are formed in the same step, and the gate oxide film for the second MOSFET and the gate oxide film for the third MOSFET are formed in the same step.

2. The method according to claim 1, wherein when the mask insulation film is etched anisotropically, the gate oxide films are also etched away using the resist pattern and the first to third gate electrodes as masks.

* * * * *